United States Patent [19]
Okabayashi

[11] Patent Number: 5,467,363
[45] Date of Patent: Nov. 14, 1995

[54] LASER DRIVE APPARATUS

[75] Inventor: Eiji Okabayashi, Toyokawa, Japan

[73] Assignee: Minolta Co., Ltd., Osaka, Japan

[21] Appl. No.: 352,810

[22] Filed: Dec. 1, 1994

[30] Foreign Application Priority Data

Dec. 13, 1993 [JP] Japan .................................. 5-312084

[51] Int. Cl.$^6$ .................................................. H01S 3/00
[52] U.S. Cl. ........................... 372/38; 372/31; 372/26
[58] Field of Search .................................. 372/38, 31, 26

[56] References Cited

U.S. PATENT DOCUMENTS 4,816,863  3/1989  Lee .
5,305,057  4/1994  Hattori et al. .

Primary Examiner—Leon Scott, Jr.
Attorney, Agent, or Firm—Burns, Doane, Swecker & Mathis

[57] ABSTRACT

A laser drive apparatus capable of modulating the intensity of a laser output in conformity with a variation in the intensity of laser output. In this apparatus, the interval of laser emission intensity between 40% and 100% is equally divided by the number of intensity levels, the magnitude of the laser drive current (digital data) corresponding to the intensity levels is determined by computation, the results of this computation are memorized by the lookup table RAM (LUTRUM) 14, and the control of intensity levels is effected by the digital data in the LUTRAM 14.

9 Claims, 7 Drawing Sheets

| INTENSITY LEVEL (STEP) | 0 | 1 | 2 | 3 | 4 | 5 | 6 | 7 | 8 | 9 | 10 |
|---|---|---|---|---|---|---|---|---|---|---|---|
| LASER POWER (%) | 0 | 10 | 20 | 30 | 40 | 50 | 60 | 70 | 80 | 90 | 100 |
| (mW) | 0 | 0.035 | 0.070 | 0.105 | 0.140 | 0.175 | 0.210 | 0.245 | 0.280 | 0.315 | 0.350 |
| DOT AREA RATIO (%) | 0 | 0 | 0 | 0 | 7.5 | 31.25 | 47.5 | 67.5 | 80.0 | 92.5 | 100 |

| INTENSITY LEVEL (STEP) | 0 | 1 | 2 | 3 | 4 | 5 | 6 | 7 | 8 | 9 | 10 |
|---|---|---|---|---|---|---|---|---|---|---|---|
| LASER POWER (%) | 0 | 40 | 46.7 | 53.3 | 60 | 66.7 | 73.3 | 80 | 86.7 | 93.3 | 100 |
| (mW) | 0 | 0.140 | 0.163 | 0.187 | 0.210 | 0.233 | 0.257 | 0.280 | 0.303 | 0.327 | 0.350 |
| DOT AREA RATIO (%) | 0 | 8.9 | 20.3 | 36.7 | 48.1 | 59.5 | 72.2 | 79.7 | 87.3 | 94.9 | 100 |

LASER DRIVE APPARATUS

BACKGROUND OF THE INVENTION

This invention relates to a laser drive apparatus for controlling the emission intensity of a laser output.

In a print apparatus such as the laser-beam printer which forms a toner image on a recording paper by the electro-photo-graphic copying method, the concentration of the image formed on the recording paper is expressed by the assignment of intensity levels and the assignment of intensity levels is effected, for example, by varying the size (area) of each dot of the image. Since the size of each dot can be varied by varying the emission intensity of a laser beam, the practice of modulating the laser output itself in accordance with intensity levels has been in vogue in the reproduction of an image.

The method heretofore adopted for controlling the emission intensity of a laser output by intensity levels as described above has comprised preparing a γ compensation ROM in which intensity levels to be controlled has been written as data, retrieving pertinent data stored in the ROM to ensure generation of such laser outputs as permit reproduction of linear gradation, and controlling the laser outputs on the basis of the retrieved data.

Since the conventional modulation of the intensity of a laser output relies on the control of the laser output according to the data stored in the ROM as mentioned above, the laser using an input current of a fixed magnitude emits a varied emission when the output intensity of the laser is varied as when the laser output is varied by a change in temperature, for example. When ROM data so stored as to permit linear assignment of intensity levels are used, therefore, the problem is posed that the laser will fail to effect linear assignment of intensity levels as an output because the ROM data do not incorporate variations due to changes in temperature.

SUMMARY OF THE INVENTION

An object of this invention is to provide a laser drive apparatus which is capable of modulating the intensity of a laser output in accordance with a variation in the intensity of laser output.

Specifically, this invention concerns a laser drive apparatus in a laser-beam printer, comprising a drive circuit for feeding a drive current to a laser diode and causing the laser diode to emit a laser beam, the drive circuit being adapted to vary the emission intensity of the laser beam by varying the drive current fed to the laser diode, detection means for detecting the intensity of the emitted laser beam, variation means for successively varying the drive current of the drive circuit, first memory means for memorizing the magnitude of the drive current existing at the time that the detection means detects the fact that the magnitude of the laser beam reaches a first level, second memory means for memorizing the magnitude of the drive current existing at the time that the detection means detects the fact that the magnitude of the laser beam reaches a second level different from the first level, arithmetic means for computing the magnitude of the drive current corresponding to a relevant concentration level by dividing the difference between the magnitudes of drive current memorized in the first memory means and the second memory means by the number of intensity levels, and conversion means for receiving an image data indicating the concentration level of each picture element, converting the image data into a signal corresponding to the drive current based on the result of the computation by the arithmetic means, and issuing the signal to the drive circuit.

BRIEF DESCRIPTION OF THE DRAWINGS

The invention will be better understood and the objects and features thereof other than those set forth above will become apparent when consideration is given to the following detailed description, which makes reference to the annexed drawings wherein.

DETAILED DESCRIPTION OF THE INVENTION

Now, this invention will be described in detail below with reference to the annexed drawings.

The laser drive apparatus of this invention is applied to a laser-beam printer. The construction of the laser-beam printer is already known widely as from FIG. 1 of U.S. Pat. No. 5,305,057 and will be omitted from the detailed description herein. In the laser-beam printer contemplated by this invention, the reproduction of an image of varied intensity levels is attained by modulating the intensity of laser beam in accordance with the concentration of the image to be printed and exposing a sensitive material to the image.

Figure 1:
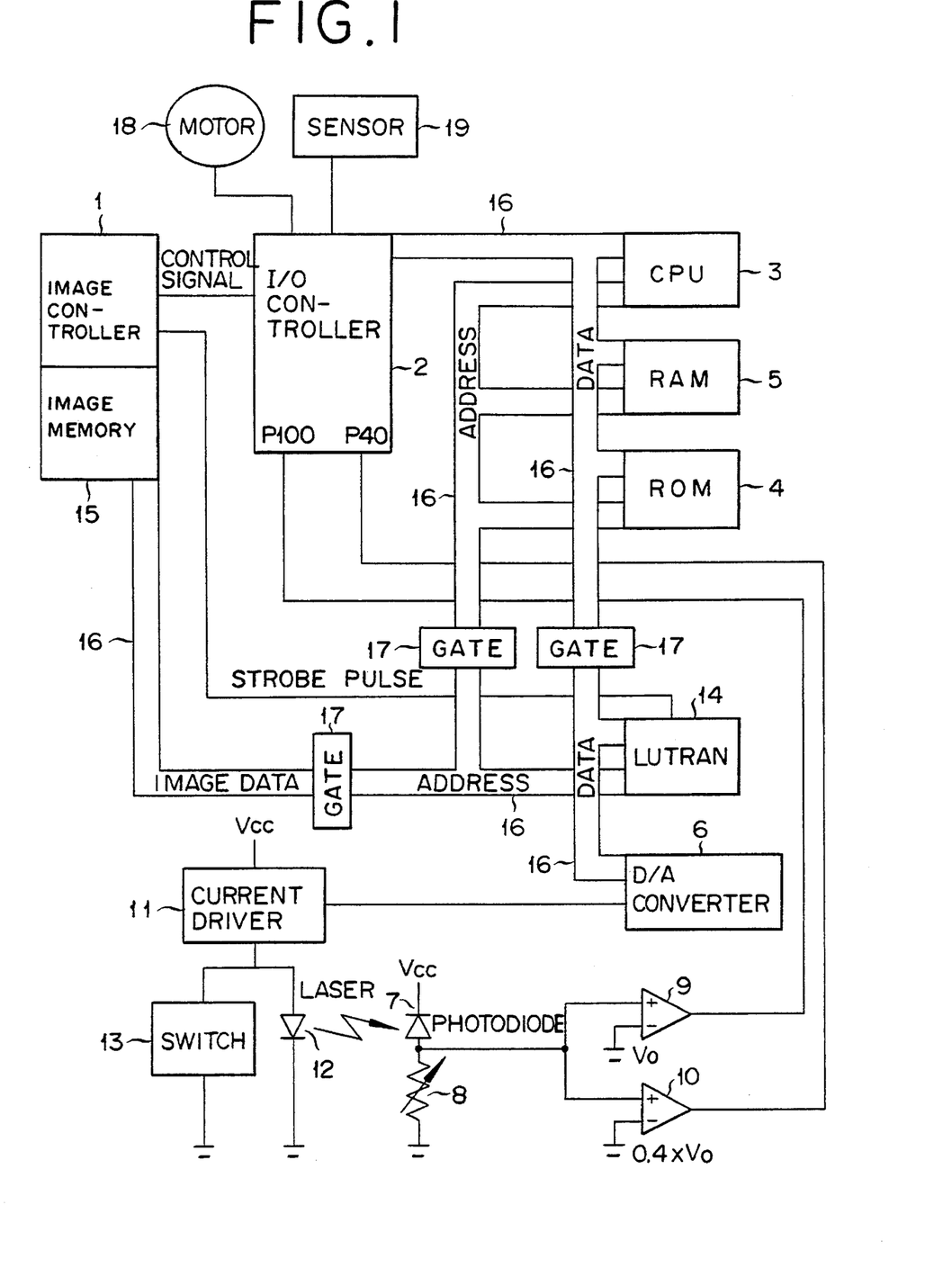
FIG. 1 is a block diagram illustrating one example of a control system having a laser drive apparatus of this invention applied to a laser-beam printer.

FIG. 1 is a block diagram illustrating one example of the control system having the laser drive apparatus of this invention applied to the laser-beam printer. This laser drive apparatus is provided with an image controller 1 for developing a character information introduced into the laser-beam printer in the form of a bitmap and performing such operations as image compensation. To the image controller 1 is connected an I/O controller 2 which controls the input and output of signals. To this I/O controller 2 are connected a CPU 3 for controlling the laser-beam printer and computing digital values corresponding to the magnitudes of laser drive current of relevant intensity levels, a ROM 4 for memorizing a program for performing the control of the laser-beam printer, a RAM 5 for provisionally storing the result of the operation of the CPU 3, and a D/A converter 6 for converting digital signals for the control of current into analog signals. This laser drive apparatus is provided with a photodiode 7 for monitoring the intensity of laser output, a variable resistor 8 for converting the magnitude of current of the photodiode 7 into the magnitude of voltage, a comparator 9 for comparing the monitor current (magnitude of voltage) of the photodiode 7 with the standard voltage ($V_0$) equivalent to 100% output, and a comparator 10 for comparing the monitor current (magnitude of voltage) of the photodiode 7 with the standard voltage ($0.4 \times V_0$) equivalent to 40% output. The comparators 9 and 10 each issue a signal of Hi when the laser power is found to be equal or larger or a signal of Lo when it is found to be smaller in consequence of the comparison. The output signals thus emitted by the comparators 9 and 10 are delivered to prescribed input ports of the I/O controller 2. To the D/A converter 6, a current driver 11 for feeding to a laser diode 12 a current proportionate to the level of an analog output voltage from the D/A converter 6. A switch 13 adapted to be turned ON/OFF by the ON/OFF signal of the laser is connected to the current driver 11 parallelly to the laser diode 12. To the I/O controller 2 is further connected a lookup table RAM 14 (hereinafter referred to briefly as "LUTRAM") serving as a lookup table for storing digital data computed by the CPU 3 and sorted in intensity levels at addresses assigned to the intensity levels. During the course of auto power control, the LUTRAM 14 delivers the result of computation by the CPU 3 as an output to the D/A converter 6 in accordance with the image data (intensity level data). The laser-beam printer of the present embodiment is provided in the image controller 1 thereof with an image memory 15 which provisionally stores introduced image data. The I/O controller 2, the CPU 3, the ROM 4, the RAM 5, the D/A converter 6, the LUTRAM 14, and the image memory 15 are interconnected through the medium of a data bus 16. The data bus 16 is provided with gates 17 for controlling the flow of data and which are controlled by the CPU 3. To the I/O controller 2 are connected a motor 18 and a sensor 19. The motor 18 is a drive source for driving the laser-beam printer and is adapted to impart a driving force to movable parts (such as, for example, rollers for conveying papers and a sensitive drum) inside the laser-beam printer. The sensor 19 functions to detect the states of various parts of the laser-beam printer. It is, for example, a sensor for the detection of the position of a paper being conveyed.

The operation of the laser-beam printer for the laser drive contemplated by this invention comprises finding by the operation of the CPU 3 the magnitude of a laser drive current proper for pertinent intensity levels for the purpose of obtaining a laser emission intensity fit for the number of intensity levels necessary for assignment of intensity levels, causing the digital data consequently obtained as sorted by intensity levels to be memorized in the LUTRAM 15, and effecting the control of intensity levels of the image data on the basis of the digital data in the LUTRAM 15.

Figure 2:
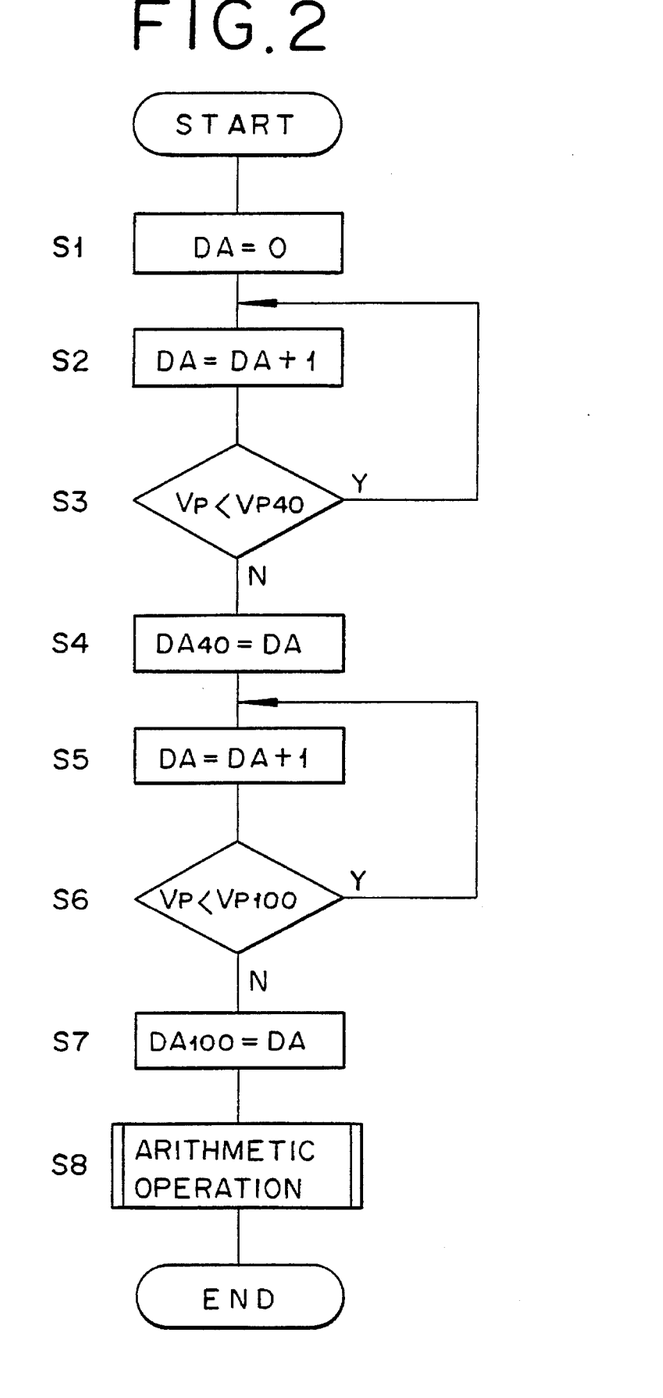
FIG. 2 is a flow chart illustrating the operation of a CPU shown in FIG. 1.

FIG. 2 is a flow chart showing the process for obtaining digital data as sorted by intensity levels. In the present embodiment, the interval of laser output between 40% and 100% is equally divided by the required number of intensity levels, i.e. 256 intensity levels in the present case, so that the assignment of intensity levels may be attained linearly between 40% and 100%. The process shown in FIG. 2 is implemented by the CPU 3.

First, at the steps S1 through S7, the input counter values of D/A converter found when the amounts of the output light of laser are 40% and 100% are memorized. Specifically, the input counter value DA of the D/A converter 6 is first reset to 0 (S1). This input counter value is a signal of 8 bits when a given laser output is subjected to intensity modulation on the scale of 256 levels. When this counter value is increased by 1, the laser output is enlarged by one level.

Then, the counter value is continuously increased by 1 at a time at the step S2. At the step S3, the processing of the step S2 is repeated until the output signal of the comparator 10 is turned to Hi. To be specific, when the monitor voltage $V_P$ of the photodiode 7 serving to monitor the output intensity of the laser is equal to or more than the standard voltage $0.4 \times V_0$ ($V_{P40}$) equivalent to 40% output and, consequently, the output signal of the comparator 10 turns to Hi, this signal enters the port of P40 of the I/O controller 2 and advances via the data bus 16 to the CPU 3 and informs the CPU 3 of the fact that the output of the comparator 10 has turned to Hi. When the signal of Hi enters the port of P40 of the I/O controller 2 and, consequently, the luminous energy of the laser equals 40% of the standard luminous energy (luminous energy of 100%), the counter value DA existent at this time is stored as the counter value $DA_{40}$ equivalent to 40% of the luminous energy in the RAM 5 (Step 4).

Then, the counter value is continuously increased by 1 at a time (S5) and the processing of Step 5 is repeated until the output signal of the comparator 9 is turned to Hi. To be specific, when the monitor voltage $V_P$ of the photodiode 7 is equal to or more than the standard voltage $V_0$ ($V_{P100}$) equivalent to 100% output, the comparator 9 issues the signal of Hi and the signal of Hi enters the port of P100 of the I/O controller 2, with the result that the CPU 3 will be informed of the fact that the output of the comparator 9 has been turned to Hi. When the signal of Hi enters the port of P100 of the I/O controller 2 and, consequently, the laser output equals 100%, the counter value DA existent at this time is stored as the counter value $DA_{100}$ equivalent to the luminous energy of 100% in the RAM 5 (S7). Incidentally, the standard voltage $V_0$ means the voltage which exists when the luminous energy of laser output equivalent to 100% of a dot area ratio is detected by the photodiode 7. It is normally about 3 V.

Figure 3:
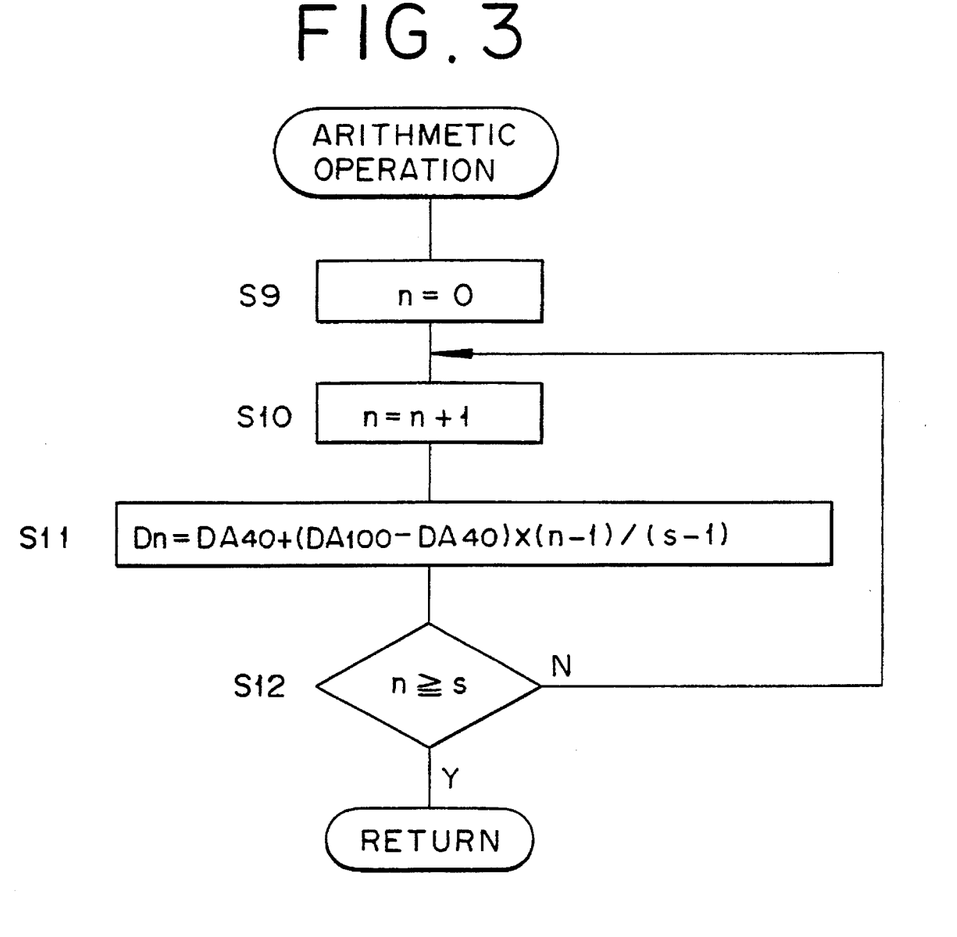
FIG. 3 is a flow chart of an arithmetic operation shown in FIG. 2.

Then, at the step S8, the input counter value of D/A counter to be stored at the address of the LUTRAM 14 is computed on the basis of the counter value $DA_{40}$ stored at the step S4 and the counter value $DA_{100}$ stored at the step S7. To be specific, this arithmetic operation consists in equally dividing the interval of the luminous energy between 40% and 100% by the number of intensity levels. FIG. 3 shows the sub-routine for this arithmetic operation. In FIG. 3, the symbol "s" stands for the number of steps of intensity (256 in the present embodiment) and the symbol "$D_n$" for the input counter value of D/A converter at the step of n. By this arithmetic operation, the laser output from 40% to 100% is equally divided into 265 steps. Incidentally, the processing shown in FIG. 3 is likewise executed by the CPU 3.

Specifically, first the value of the parameter n is reset to zero (Step S9). Then, the value of n is increased by an increment of 1 (Step S10) and the value of $D_n$ is computed in accordance with the following formula (Step S11).

$D_n = DA_{40} + (DA_{100} - DA_{40}) \times (n-1)/(s-1)$

The processings of the steps S10 and S11 are repeated at the step S12 until the value of n is equal to or more than the number of steps of intensity s (256). During this arithmetic operation, the value of $D_n$ ($D_1 \sim D_{256}$) is stored at the corresponding one of the addresses assigned to the intensity levels within the LUTRAM 14. As a result, addresses are assigned one each to the individual intensity levels and the digital data for effecting laser emission at each intensity level are stored in the LUTRAM 14.

Figure 4A:
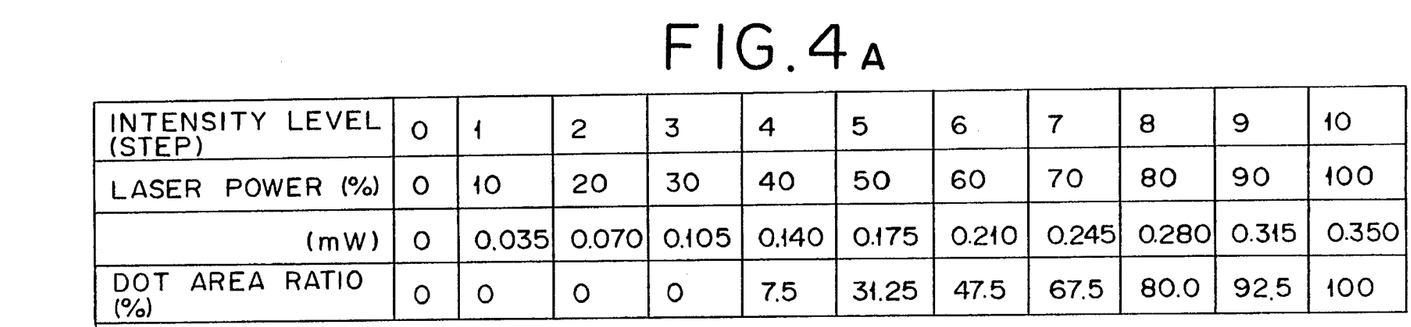
FIG. 4A is a table showing the result of an image simulation before compensation and FIG. 4B is a graph showing the relation between an emission intensity and a surface area ratio shown in FIG. 4A.
Figure 4B:
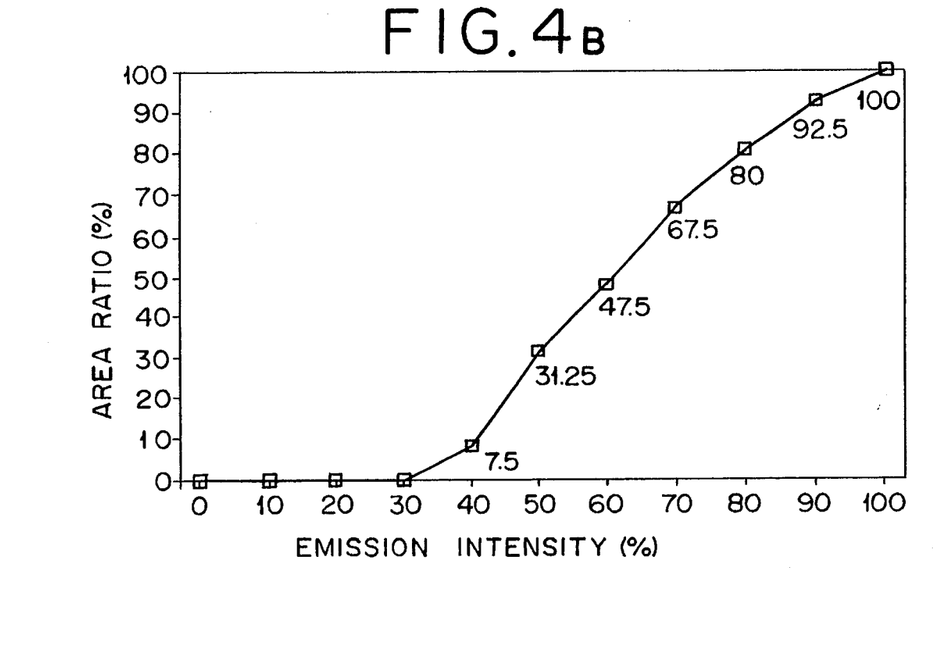
Figure 5A:
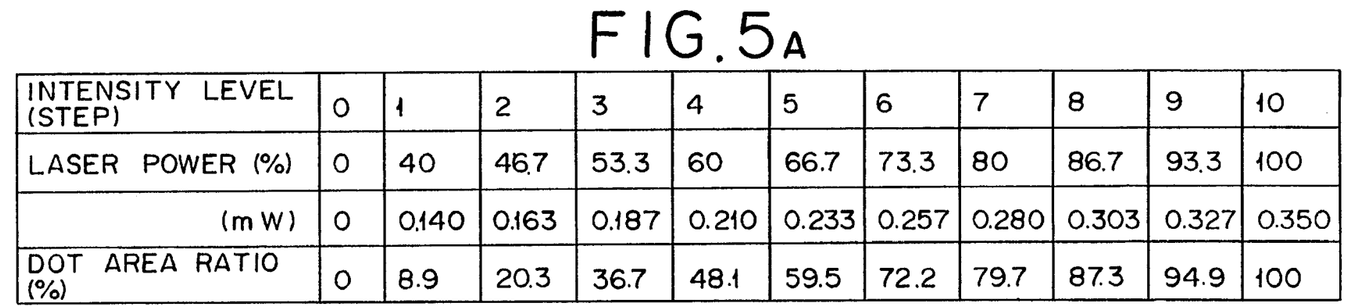
FIG. 5A is a table showing the result of an image simulation after compensation and FIG. 5B is a graph showing the relation between an emission intensity and a surface area ratio shown in FIG. 5A.
Figure 5B:
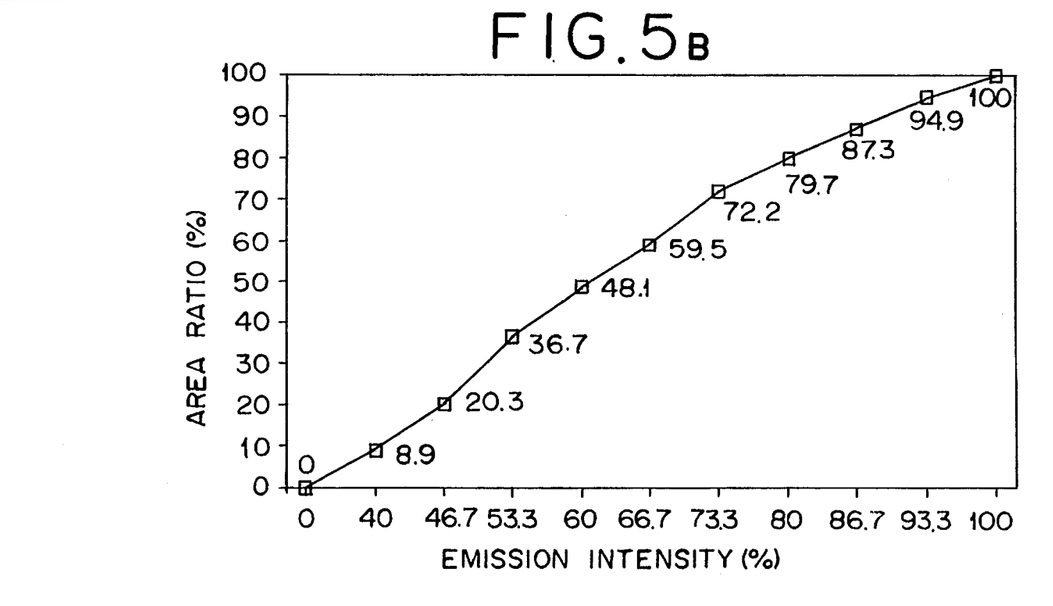

In the present embodiment, the counter values between the laser outputs 40% and 100%, namely those which are determined by dividing the interval of laser output between 40% and 100% by the number of intensity levels (256 steps), are exclusively used because no dot is formed on a sensitive material until the emission intensity reaches 40%, namely because no linear assignment of intensity levels is obtained even when the interval of laser output from 0% to 100% is divided by 256. The present embodiment, therefore, contemplates storing the counter values $DA_{40}$ and $DA_{100}$ of the laser outputs of 40% and 100% because the interval of the laser output of 40% to 100% is used for the purpose of intensity modulation. By equally dividing the interval of laser output from 40% to 100% by 256, linear assignment of intensity levels in the form of dot areas can be attained as shown in the table of FIG. 5A and the graph of FIG. 5B. FIG. 4 and FIG. 5 represent the case of effecting laser drive by the use of 10 intensity levels for the sake of simplicity of illustration. The principle of operation depicted thereby holds good for the laser drive by the use of 256 intensity levels.

Figure 6:
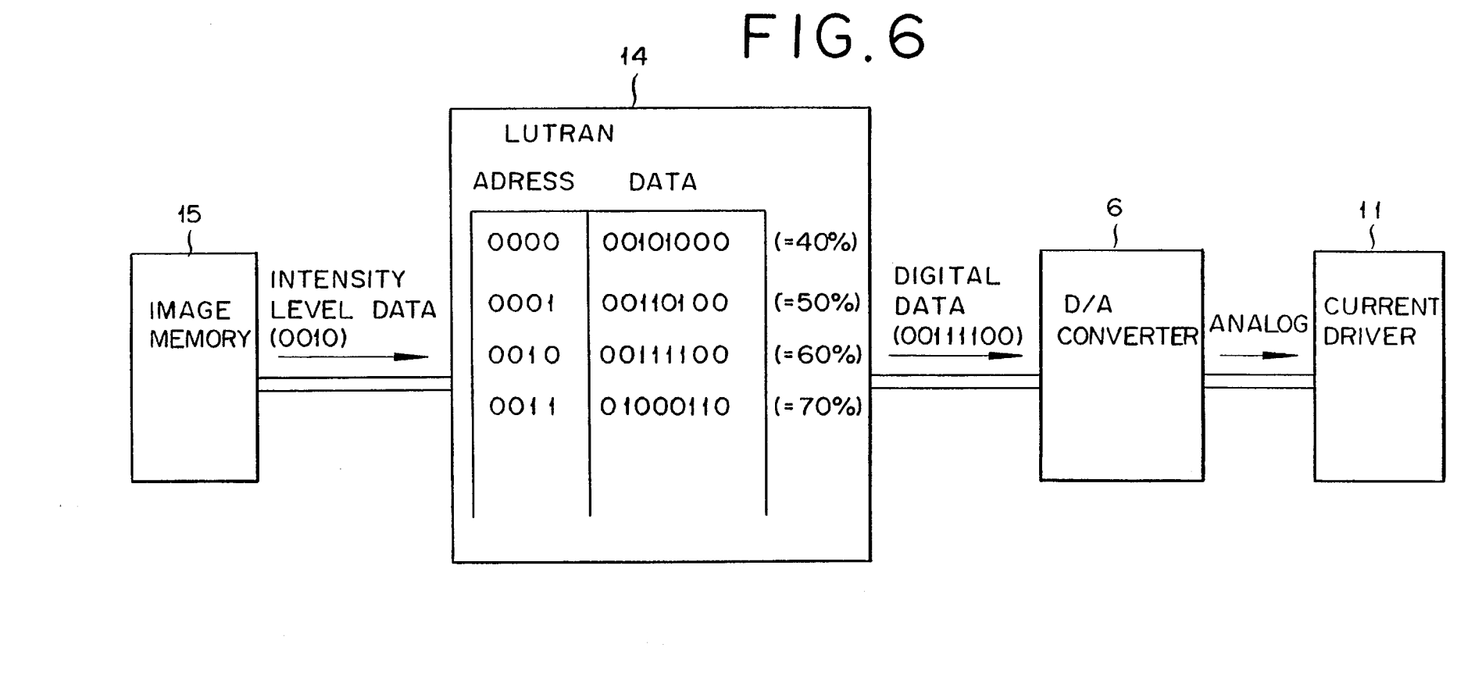
FIG. 6 is a block diagram illustrating conceptually a part for modulating laser intensity.

Now, the processing for modulation of the intensity of laser beam with the intensity signal from the image controller will be explained below. FIG. 6 is a conceptual block diagram of the main part concerning this processing.

First, the image information introduced into the apparatus is processed by the image controller 1, developed into a bitmap, and stored in the image memory 15. From the image memory 15, an intensity signal equivalent to one picture element is forwarded as image data via the data bus 16 to the LUTRAM 14. The image data equivalent to one picture element include intensity level data represented by the picture element. The LUTRAM 14 is furnished with such addresses as conform to the intensity level data. The LUTRAM 14 stores digital data for the control of electric current corresponding to the intensities computed as described above during the course of auto power control by the CPU 3 in accordance with the flow charts of FIG. 2 and FIG. 3. In response to the intensity level data received from the image memory 15, the LUTRAM 14 emits the digital data at the relevant addresses to the D/A converter 6. In the case of the setup illustrated in FIG. 6, for example, when intensity level data "0010" are introduced into the LUTRAM 14, the data "00111100" of the relevant address are transmitted to the D/A converter 6. At this time, the data output from the LUTRAM 14 has its timing controlled by the strobe pulse emitted from the image controller 1. The digital data which have been forwarded to the D/A converter 6 are converted into analog values, introduced into the current driver 11, and utilized therein for causing the laser 12 to effect emission at a luminous energy corresponding to the intensity level data (or digital data). The light emission for one picture element is attained by the fact that the switch 13 is turned ON/OFF when the emission of the laser 12 is turned ON/OFF.

Figure 7:
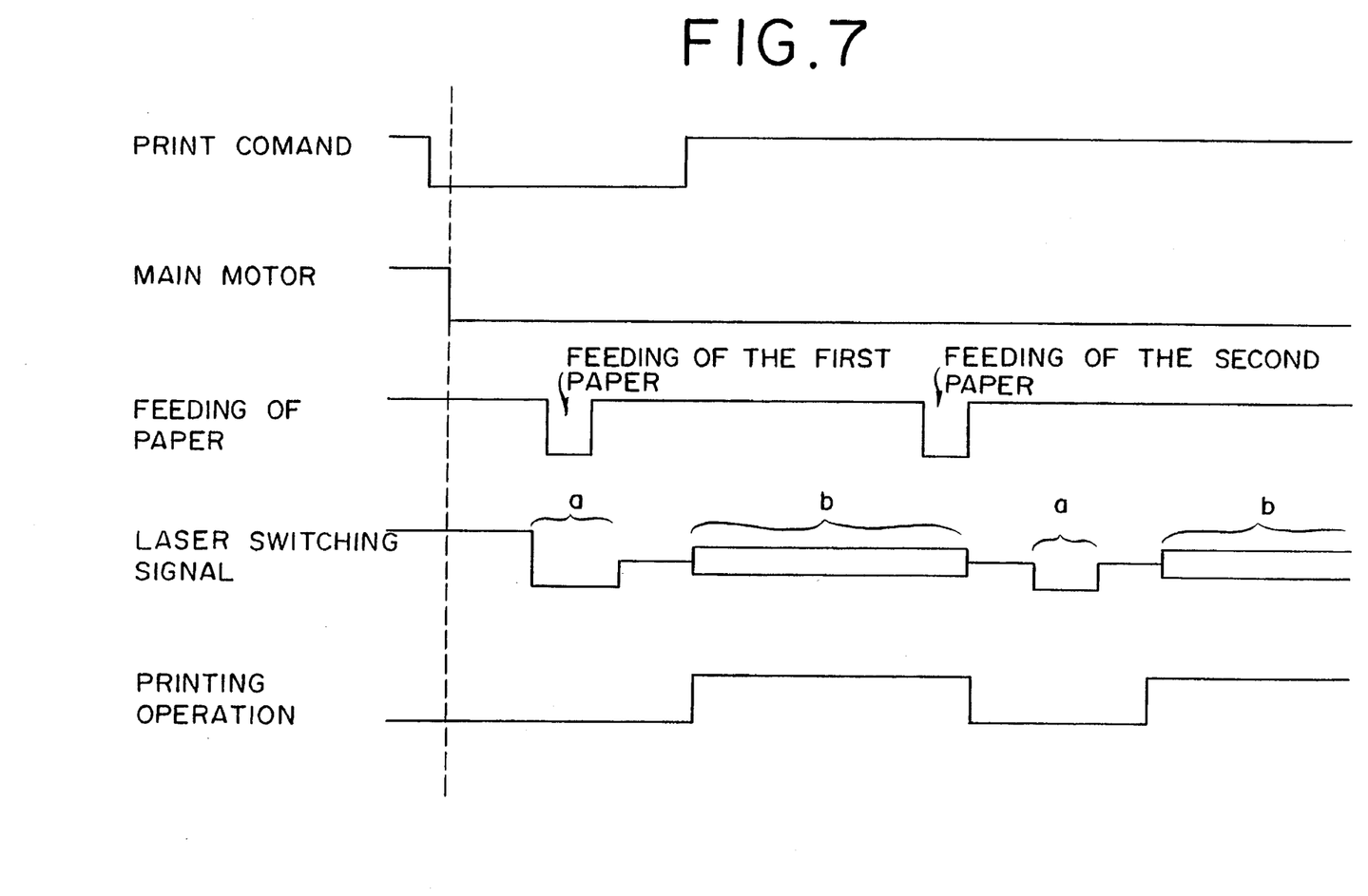
FIG. 7 is a time chart showing part of the printing operation of the laser-beam printer.

FIG. 7 is a time chart of the operation of the laser-beam printer.

When a print command is received from an external input device such as a computer, the main motor 18 is set rotating. When the motor 18 starts and begins to rotate normally, the feeding of the first paper is started. Between the time the main motor 18 is set rotating and the time the printing operation on the fed paper (laser modulation) is started, a laser switching signal is set at the low level and the laser is turned on and the processing of the flow chart illustrated in FIG. 2 and FIG. 3 is executed. Then, the image data are read out of the image memory 15, the digital data corresponding to the read image data are converted into analog values and delivered to the current driver 11, the laser beam intensity is modulated, and the image is written in. The processing illustrated in FIG. 2 and FIG. 3 is also executed between the first and the second image. On the time chart of FIG. 7, the part indicated by the symbol "a" represents the duration of the execution of the auto power control. At this part, the contents of the LUTRAM 14 are rewritten one print at a time during the course of the auto power control. The part indicated by the symbol "b" represents the duration in which the laser emission is proceeding with the intensity thereof modulated by the intensity signal from the image controller 1 (image data from the image memory 15).

In accordance with this invention, by producing and rewriting the digital data inside the LUTRAM 14 during the suspension of the printing operation of the laser-beam printer as in the process of auto power control or immediately before the start of the printing operation, linear assignment of intensity levels can be always attained even when the luminous energy of the laser output is varied as by a change of temperature. Further, the fact that the circuit configuration is simple and the number of component parts is small contributes to lower the cost of the apparatus.

The present embodiment involves the rewriting of the digital data in the LUTRAM 14 for the printing on each paper during the course of auto power control. This particular manner of rewriting is not critical for this invention. Alternatively, the rewriting of digital data may be carried out while the power source for the laser-beam printer is ON or it may be effected at intervals of a fixed plurality of papers. Otherwise, the apparatus may be separately provided with means for detecting the temperature in the vicinity of the laser and the rewriting of digital data may be effected when a change is detected in the ambient temperature of the laser.

What is claimed is:

1. A laser drive apparatus in a laser-beam printer, comprising:

a drive circuit for feeding a drive current to a laser diode and causing the laser diode to emit a laser beam;

said drive circuit being adapted to vary the emission intensity of the laser beam by varying the drive current fed to the laser diode, detection means for detecting the intensity of the emitted laser beam;

variation means for successively varying the drive current of said drive circuit;

first memory means for memorizing the magnitude of the drive current existing at the time that said detection means detects the fact that the magnitude of the laser beam reaches a first level;

second memory means for memorizing the magnitude of the drive current existing at the time that said detection means detects the fact that the magnitude of the laser beam reaches a second level different from the first level;

arithmetic means for computing the magnitude of the drive current corresponding to a relevant concentration level by dividing the difference between the magnitudes of drive current memorized in said first memory means and said second memory means by the number of intensity levels; and conversion means for receiving an image data indicating the concentration level of each picture element, converting the image data into a signal corresponding to the drive current based on the result of the computation by said arithmetic means, and issuing the signal to said drive circuit.

2. A laser drive apparatus according to claim 1, wherein said conversion means is provided with a lookup table adapted to store the result of the computation by said arithmetic means and written on a RAM.

3. A laser drive apparatus for modulating the intensity of a laser beam in accordance with image data indicating a concentration level of each picture element, comprising:

a drive circuit for feeding a drive current to a laser diode and causing the laser diode to emit a laser beam;

conversion means provided with a lookup table memorizing the relation between a concentration level of image data and a drive current level of a laser diode and adapted to convert input image data into a signal indicating the drive current level of the laser diode by consulting the lookup table and feeding the signal to said drive circuit;

said drive circuit being adapted to vary the drive current to be given to the laser diode in response to said signal given by said conversion means and modulate the emission intensity of the laser diode, control means for controlling said drive circuit prior to the printing operation and performing test emission of the laser diode while varying the drive current thereof;

a sensor for detecting the intensity of the laser beam emitted from the laser diode;

memory means for memorizing the values of drive current existing when first and second emission intensities are detected by said sensor in said test emission; and means for rewriting the lookup table of said conversion means based on the values of drive current memorized by said memory means, whereby the printing operation is executed by the rewritten lookup table.

4. A laser drive apparatus according to claim 3, wherein said test emission is carried out between the time a print command is received and the time the laser beam is modulated by the image data.

5. A laser drive apparatus according to claim 3, wherein said test emission is carried out between the formation of image data from two successive copies.

6. A laser drive apparatus for modulating the intensity of a laser beam in conformity with digital image data indicating the concentration level of each picture element, comprising:

a drive circuit for delivering a drive current to a laser diode and causing the laser diode to emit a laser beam;

conversion means provided with a lookup table memorizing the relation between a concentration level of image data and a drive current level of a laser diode and adapted to convert digital input image data into a digital signal indicating the drive current level of the laser diode by consulting the lookup table;

a D/A converter provided between said conversion means and said drive circuit and adapted to convert the digital signal from said conversion means into an analog signal and deliver the analog signal to said drive circuit;

said drive circuit being adapted to vary the level of the drive current to be given to the laser diode in conformity with said analog signal and modulate the emission intensity of the laser diode, control means for performing test emission of the laser diode prior to the printing operation;

said control means being provided with a counter and adapted to emit to said D/A converter a digital signal indicating the count value of the counter and, during the course of the test emission, vary the emission intensity of the laser diode by successively advancing the counter, a sensor for detecting the intensity of the laser beam emitted from the laser diode;

memory means for memorizing the count values of said counter existing when first and second emission intensities are detected by said sensor in said test emission; and means for rewriting the lookup table of said conversion means based on the count values memorized by said memory means, whereby the printing operation is executed by the rewritten lookup table.

7. A laser drive apparatus according to claim 6, wherein said test emission is carried out between the time a print command is received and the time the laser beam is modulated by the image data.

8. A laser drive apparatus according to claim 6, wherein said test emission is carried out between the formation of image data from two successive copies.

9. A laser drive method for modulating the intensity of a laser beam by converting image data indicating the concentration level of each picture element into a drive current of a laser diode with reference to a lookup table, comprising:

a step of causing emission of a laser beam while varying the drive current prior to the modulation of the laser beam based on image data;

a step of detecting the intensity of the laser beam emitted during the preceding step and memorizing the values of drive current existing when the intensity reaches the first and the second level;

a step of computing the values of drive current at varying concentration levels by dividing the difference of drive current memorized during the preceding step by the number of intensity levels;

a step of rewriting the lookup table in accordance with the result of computation during the preceding step; and a step of modulating the intensity of the laser beam in accordance with the image data by the use of the rewritten lookup table.

* * * * *